US009634209B2

(12) United States Patent
Chan et al.

(10) Patent No.: US 9,634,209 B2
(45) Date of Patent: Apr. 25, 2017

(54) MINIATURE SURFACE MOUNT DEVICE

(71) Applicant: Cree, Inc., Durham, NC (US)

(72) Inventors: Chi Keung Chan, Sheung Shui (HK);
Chak Hau Pang, Fanling (HK); Fei Hong Li, Huizhou (CN); David Todd Emerson, Chapel Hill, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/012,764

(22) Filed: Aug. 28, 2013

(65) Prior Publication Data
US 2013/0341656 A1 Dec. 26, 2013

Related U.S. Application Data

(63) Continuation of application No. PCT/CN2011/000334, filed on Mar. 2, 2011.

(51) Int. Cl.
*H01L 33/00* (2010.01)
*H01L 33/62* (2010.01)
(Continued)

(52) U.S. Cl.
CPC .......... *H01L 33/62* (2013.01); *H01L 33/486* (2013.01); *H01L 24/85* (2013.01); *H01L 24/97* (2013.01);
(Continued)

(58) Field of Classification Search
CPC ... H01L 33/62; H01L 33/486; H01L 2224/85; H01L 2924/12041; H01L 24/97;
(Continued)

(56) References Cited

U.S. PATENT DOCUMENTS

| 7,435,143 B2 | 10/2008 | Anderlini |
| D585,848 S | 2/2009 | Kim et al. |

(Continued)

FOREIGN PATENT DOCUMENTS

| WO | WO 2008/081696 A1 | 7/2008 |
| WO | WO 2008/130140 A1 | 10/2008 |

OTHER PUBLICATIONS

ISR to PCT/CN2011/000334, dated Jun. 9, 2011 (5p).
(Continued)

*Primary Examiner* — Su C Kim
(74) *Attorney, Agent, or Firm* — Brinks Gilson & Lione

(57) ABSTRACT

A surface mount LED package includes a lead frame carrying a plurality of LEDs and a plastic casing at least partially encasing the lead frame. The lead frame includes an electrically conductive chip carrier and first, second, and third electrically conductive connection parts separate from the electrically conductive chip carrier. Each of the first, second and third electrically conductive connection parts has an upper surface, a lower surface, and a connection pad on the upper surface. The plurality of LEDs are disposed on an upper surface of the electrically conductive chip carrier. Each LED has a first electrical terminal electrically coupled to the electrically conductive chip carrier. Each LED has a second electrical terminal electrically coupled to the connection pad of a corresponding one of the first, second, and third electrically conductive connection parts.

43 Claims, 4 Drawing Sheets

(51) Int. Cl.
*H01L 33/48* (2010.01)
*H01L 25/075* (2006.01)
*H01L 23/00* (2006.01)

(52) U.S. Cl.
CPC *H01L 25/0753* (2013.01); *H01L 2224/48091* (2013.01); *H01L 2224/48247* (2013.01); *H01L 2224/48257* (2013.01); *H01L 2224/85* (2013.01); *H01L 2224/97* (2013.01); *H01L 2924/09701* (2013.01); *H01L 2924/12041* (2013.01)

(58) Field of Classification Search
CPC .............. H01L 24/85; H01L 25/0753; H01L 2224/48091; H01L 2224/48247; H01L 2224/48257; H01L 2224/97; H01L 2924/09701
See application file for complete search history.

(56) References Cited

U.S. PATENT DOCUMENTS

| | | | |
|---|---|---|---|
| D586,302 S | 2/2009 | Kim et al. | |
| D595,675 S * | 7/2009 | Wang | D13/180 |
| D606,948 S | 12/2009 | Hussell et al. | |
| D606,950 S | 12/2009 | Ariizumi | |
| D611,012 S | 3/2010 | Hsieh | |
| D615,504 S | 5/2010 | Keller et al. | |
| D626,257 S | 10/2010 | Pickard | |
| D633,099 S | 2/2011 | Van de Ven et al. | |
| 7,888,852 B1 | 2/2011 | Sung | |
| 8,049,230 B2 | 11/2011 | Chan et al. | |
| D659,657 S | 5/2012 | Hussell | |
| 8,217,414 B2 | 7/2012 | Hayashi | |
| D667,801 S | 9/2012 | Joo et al. | |
| 8,269,244 B2 | 9/2012 | Hussell | |
| 2005/0127816 A1 | 6/2005 | Sumitani | |
| 2007/0284708 A1* | 12/2007 | Hanya | H01L 31/0203 257/676 |
| 2008/0111148 A1 | 5/2008 | Zimmerman | |
| 2008/0290353 A1 | 11/2008 | Medendorp, Jr. et al. | |
| 2008/0296605 A1* | 12/2008 | Oshio et al. | 257/99 |
| 2009/0072251 A1* | 3/2009 | Chan et al. | 257/89 |
| 2009/0129085 A1 | 5/2009 | Aizar et al. | |
| 2009/0283781 A1* | 11/2009 | Chan et al. | 257/89 |
| 2010/0102345 A1 | 4/2010 | Kong et al. | |
| 2010/0308352 A1 | 12/2010 | Liao et al. | |
| 2011/0001149 A1 | 1/2011 | Chan et al. | |
| 2011/0037083 A1 | 2/2011 | Chan et al. | |
| 2011/0248293 A1 | 10/2011 | Chan et al. | |
| 2011/0291152 A1 | 12/2011 | Liaw | |

OTHER PUBLICATIONS

ISR to PCT/CN2011/000335, dated Jun. 16, 2011 (16p).
ISR and Written Opinion for PCT/CN2011/000334, dated Jun. 9, 2011 (5p).
ISR and Written Opinion for PCT/CN2011/000335, dated Jun. 16, 2011 (16p).
Cree® PLCC4 2-in-1 SMD LED CLM4S-DKB Data Sheet, Copyright 2008-2009 Cree, Inc. (8p).
Cree® PLCC6 3-in-1 SMD LED CLP6R-FKW Data Sheet, Copyright 2009 Cree, Inc. (9p).
Cree® TR2432 LEDs Data Sheet CxxxTR2432-S-xx00,Copyright 2008 Cree, Inc. (6p).
For Cree H.K. Only PN-series AlGaInP LED Chip, Copyright 2009 Epistar Corporation (2p).
For Cree Hong Kong Limited. Phoenix N-series AlGaInP LED Chip, Copyright 2007 Epistar Corporation (2p).
U.S. Appl. No. 12/758,702, filed Apr. 12, 2010, "Surface Mount Device Thin Package" (58p).
Drawings for Design U.S. Appl. No. 29/360,791, filed Apr. 30, 2010 (4p).
U.S. Appl. No. 61/369,565, filed Jul. 30, 2010, "Water Resistant Surface Mount Device" (59p).
U.S. Appl. No. 12/939,096, filed Nov. 3, 2010, "White Ceramic LED Package" (43p).
U.S. Appl. No. 12/957,225, filed Nov. 30, 2010, Waterproof Surface Mount Device Package and Method (48p).
Office Action to U.S. Appl. No. 29/386,583, dated Oct. 4, 2012, 9p.
Notice of Allowance to U.S. Appl. No. 29/386,583, dated Aug. 23,2013, 9p.

* cited by examiner

MINIATURE SURFACE MOUNT DEVICE

RELATED APPLICATION

This application is a continuation of International Application No. PCT/CN2011/000334, filed Mar. 2, 2011, the entire content of which is incorporated by reference herein.

FIELD OF THE DISCLOSURE

The disclosure relates, generally, to surface mount devices and, more particularly, to plastic leaded chip carriers housing LED devices and to LED displays including such devices.

BACKGROUND

In recent years, there have been dramatic improvements in light emitting diode (LED) technology such that LEDs of increased brightness and color fidelity have been introduced. Due to these improved LEDs and improved image processing technology, large format, full color LED video screens have become available and are now in common use. Large format LED displays typically comprise a combination of individual LED panels providing image resolutions determined by the distance between adjacent pixels or "pixel pitch."

Outdoor displays, which are intended for viewing from greater distances, have relatively large pixel pitches and usually comprise discrete LED arrays. In the discrete LED arrays, a cluster of individually mounted red, green, and blue LEDs are driven to form what appears to the viewer as a full color pixel. On the other hand, indoor screens, which require shorter pixel pitches such as 3 mm or less, typically comprise panels carrying red, green, and blue LEDs mounted on a single electronic package such as a surface mount device (SMD) package. Each SMD usually defines a pixel. The relatively small SMDs are attached to a driver printed circuit board (PCB) that controls the output of each SMD.

Although both indoor and outdoor displays are viewable across a substantial range of off-axis angles, there is often a perceptible loss of color fidelity with increasing viewing angle. Additionally, the material of each LED package and/or the material used to mount each of the LEDs may have reflective characteristics, which can further decrease color fidelity by creating unwanted light reflection and/or glare.

It is well-known that SMDs and many other types of electronic packages, whether containing integrated circuits or discrete components such as diodes or power transistors, dissipate sufficient heat to require thermal management. Also, excessive heat may cause LEDs failures. Thus, one of the considerations for designing an LED system is effective thermal management. One of the objectives of effective thermal management in the design of electronic packaging is to maintain the operating temperature of the LEDs and other active circuit components at an appropriately low level to prevent premature component failure. Various cooling strategies including conduction heat transfer are in common use. One conventional way of implementing conduction heat transfer for dissipating heat in an electronic package is to allow the heat to conduct away along the leads of the device. However, the leads often do not have sufficient mass or exposed surface area to provide effective heat dissipation. For example, high intensity LEDs that emit light principally in the visible part of the electromagnetic spectrum can generate a significant amount of heat that is difficult to dissipate using such conventional techniques.

The designing objectives of increasing the view angle, maintaining a relatively low operating temperature, and decreasing the size of the SMD package are to some extent competitive with each other. It would be desirable to develop a SMD package that addresses all these designing objectives with lower cost.

SUMMARY

In certain embodiments, a light emitting diode (LED) package is provided with a lead frame including conductive a chip carrier and a polymer casing, for example, a plastic casing molded about the conductive chip carrier. The polymer casing includes opposed, first and second main surfaces having a height distance therebetween, opposed side surfaces having a width distance therebetween, and opposed end surfaces having a length distance therebetween. The height distance, the width distance and the length distance are less than about 2.0 mm. In certain embodiments, the casing at least partially encases the lead frame and defines a cavity extending into the interior of the casing from the first main surface, at least a portion of the electrically conductive chip carrier is exposed at the floor of the cavity. The ratio of the area of the cavity floor to the area of the first main surface is at least about 35%. In some embodiments, the ratio is greater than about 40%. In still other embodiments, the ratio is greater than about 50%.

In certain embodiments, the light emitting diode package comprises multiple LED die, for example a red LED die, a green LED die and a blue LED die, and the LED die comprise a separate input terminal and a common conductive chip carrier connected to the output terminal. As such, the LED die are independently controllable. In certain embodiments, the common mounting pad or chip carrier has increased area and acts to spread heat from the LED die.

In certain embodiments, a cavity is formed in the casing, and the LED die is mounted on the conductive chip carrier at the floor of the cavity. The common conductive chip carrier will include opposing sides where one side is at least as long as a cavity side, and the other side is greater than about ½ of the of the size of the cavity adjacent to the cavity side. In certain embodiments the area of the common chip carrier is greater than about ½ of the area of the mounting area in the cavity.

Yet another embodiment discloses an LED display including an array of the disclosed surface mount LED packages. The LED display includes a substrate carrying an array of SMDs arranged in vertical columns and horizontal rows and signal processing and LED drive circuitry. Each of the SMDs includes a casing and a vertically oriented, linear arrangement of LEDs configured to be energized to produce in combination a substantially full range of colors and to define one pixel of the display. The signal processing and LED drive circuitry are electrically connected to selectively energize the array of SMDs for displaying visual images on the LED display. Each pixel of the display has a size less than about 2.8 mm or less by about 2.8 mm or less.

DETAILED DESCRIPTION

Figure 1:
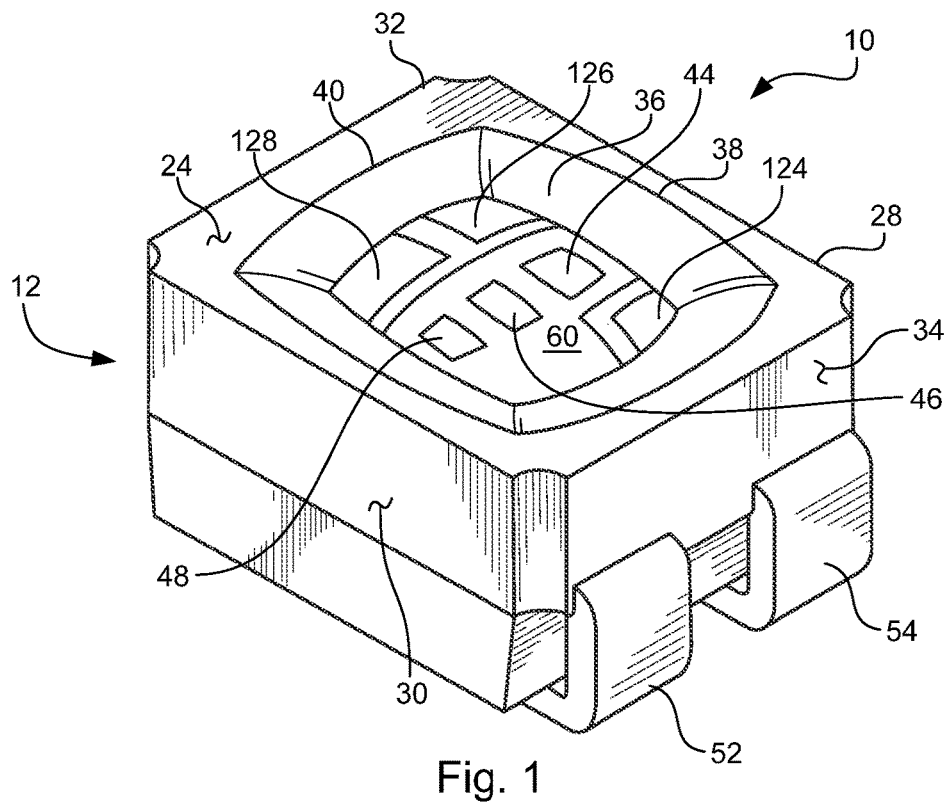
FIG. 1 is a perspective view of a surface mount device according to an embodiment of the present disclosure.

The following description presents preferred embodiments of the disclosure representing the best mode contemplated for practicing the disclosure. This description is not to be taken in a limiting sense but is made merely for the purpose of describing the general principles of the disclosure, the scope of which is defined by the appended claims.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, and the like may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

One embodiment disclose a surface mount LED package includes a lead frame carrying a plurality of LEDs and a plastic casing at least partially encasing the lead frame. The LED may also be referred to as an LED chip or an LED die in this disclosure. The lead frame includes an electrically conductive chip carrier and first, second, and third electrically conductive connection parts separate from the electrically conductive chip carrier. Each of the first, second and third electrically conductive connection parts has an upper surface, a lower surface, and a connection pad on the upper surface. The plurality of LEDs are disposed on an upper surface of the electrically conductive chip carrier. Each LED has a first electrical terminal and a second electrical terminal, wherein the first electrical terminal of each LED is electrically coupled to the electrically conductive chip carrier. The second electrical terminal of each LED is electrically coupled to the connection pad of a corresponding one of the first, second, and third electrically conductive connection parts. In some embodiments, the bent lead frame has a thickness of about ½ or less of the total package thickness. In certain embodiments, the bent lead frame profile thickness is about 0.5 mm or less, for example about 0.42 mm to 0.48 mm, and the surface mount LED package has a profile height of less than about 1.0 mm, for example from about 0.84 mm to about 0.95 mm. In some embodiments, the surface mount LED package comprises a profile height of 0.84 mm or less, and the bent lead frame has a thickness of about 0.42 mm or less.

Another embodiment example discloses a surface mount LED package that includes a lead frame carrying a plurality of LEDs and a plastic casing at least partially encasing the lead frame. The casing includes opposed, first and second main surfaces having a height distance therebetween, opposed side surfaces having a width distance therebetween, and opposed end surfaces having a length distance therebetween. The casing defines a cavity extending into the interior of the casing from the first main surface. The lead frame includes an electrically conductive chip carrier and first, second, and third electrically conductive connection parts separate from the electrically conductive chip carrier. Each of the first, second and third electrically conductive connection parts has an upper surface, a lower surface, and a connection pad on the upper surface. The plurality of LEDs are disposed on an upper surface of the electrically conductive chip carrier. Each LED has a first electrical terminal and a second electrical terminal, wherein the first electrical terminal of each LED is electrically coupled to the electrically conductive chip carrier. The second electrical terminal of each LED is electrically coupled to the connection pad of a corresponding one of the first, second, and third electrically conductive connection parts. The plurality of LEDs include LEDs that emit red, green, or blue light disposed along a first center axis of the surface mount device. The height distance is in the range of less than 1 mm, for example from about 0.84 mm to about 0.95 mm. In some embodiments, the surface mount LED package has a height of 0.84 mm or less. The width distance and the length distance are less than 2 mm, for example, in the range of about 1.85 mm to about 2.00 mm. In some embodiments, the width distance and the length distance are less than 1.85 mm or less.

Yet another embodiment discloses a lead frame including an electrically conductive chip carrier and first, second, and third electrically conductive connection parts separate from the chip carrier. The electrically conductive chip carrier has an upper surface that carries a plurality of LEDs. Each LED has a first electrical terminal and a second electrical terminal. The first terminal of each of the LEDs is electrically coupled to the chip carrier. Each of the first, second and third connection parts has an upper surface, a lower surface, and a connection pad on the upper surface. The second terminal of each of the LEDs is electrically coupled to the connection pad of a corresponding one of the first, second, and third connection parts. The first connection part is at least partially surrounded by the chip carrier. The upper surface of the first connection part has a smallest area among the upper surfaces of the first, second, and third connection parts.

Figure 2:
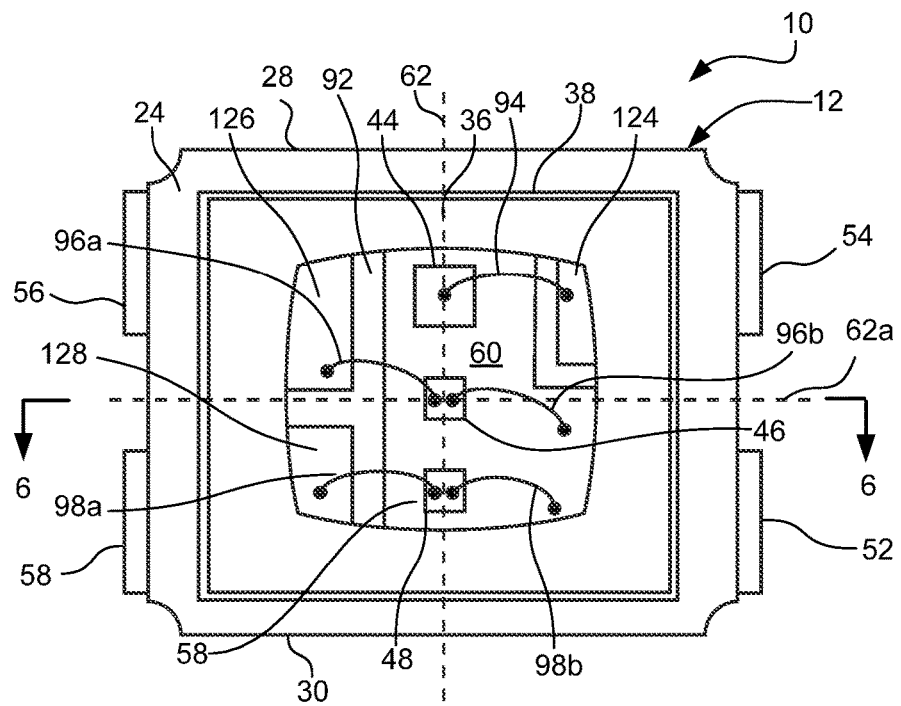
FIG. 2 is a top plan view of the embodiment shown in FIG. 1.
Figure 3:
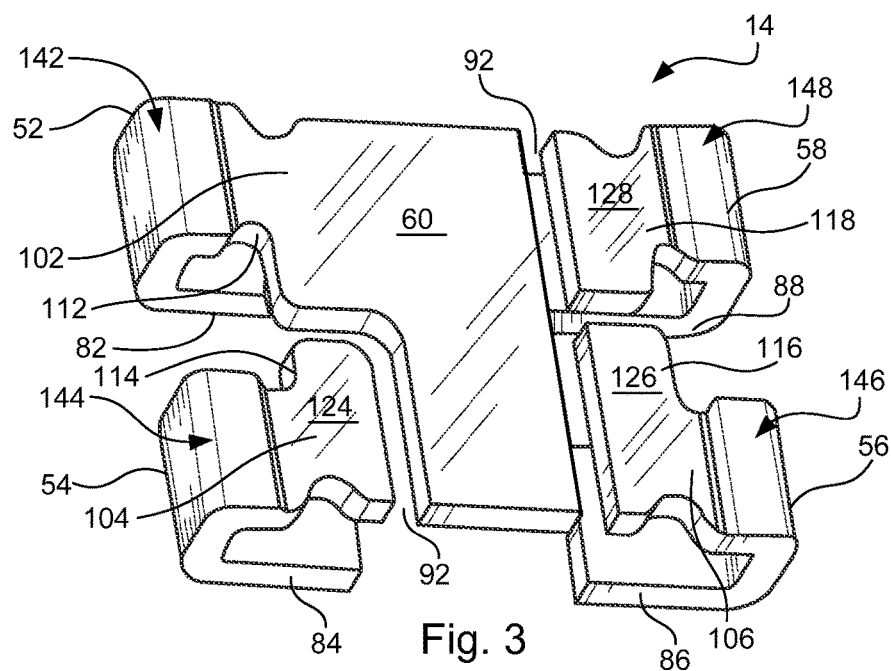
FIG. 3 is a perspective view of a lead frame in accordance with one embodiment that may be used in a surface mount device.
Figure 4:
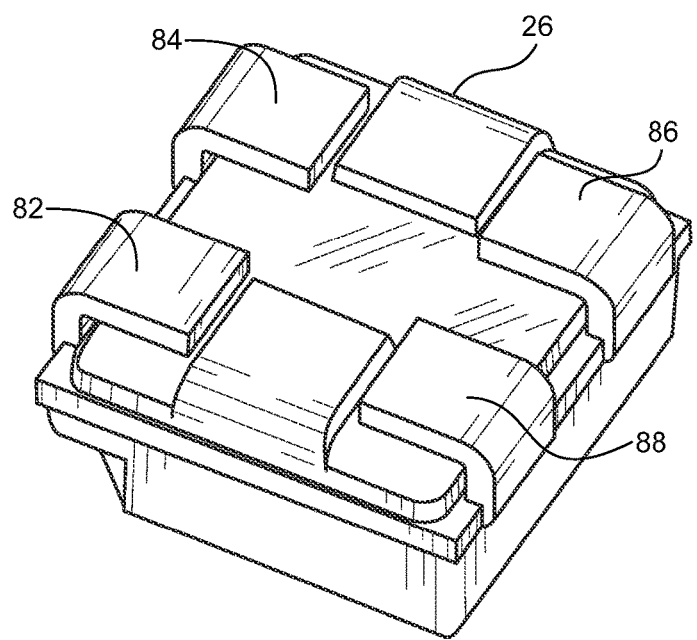
FIG. 4 is a perspective bottom view of the embodiment shown in FIG. 1.

FIGS. 1-4 depict a surface mount LED package 10 and parts thereof according to specific, exemplary embodiments for use in LED displays such as indoor and/or outdoor LED screens. The LED package 10 includes a plastic casing 12 that is at least partially encasing a lead frame 14. The lead frame 14 comprises an electrically conductive chip carrier 142 and first, second, and third electrically conductive connection parts 144, 146, and 148 separate from the electrically conductive chip carrier as shown in FIG. 3. The components of lead frame 14, including chip carrier 142 have a profile height ranging from about 0.42 mm to about 0.48 mm. In other words, the profile height is the height of the bent lead frame. For example, the profile height refers to the distance between the lower surface 82 of the chip carrier 142 and the upper surface 102 of the chip carrier 142. The lead frame metal sheet, before bending, may have a sheet thickness of less than about 0.15 mm.

The electrically conductive chip carrier 142 has an upper surface 102 including a connection pad 60. The connection pad 60 is exposed from the plastic casing 12. The connection pad 60 has opposing sides about parallel to a first center axis 62. One of the opposing sides, which is close to the connection pads 126 and 128, is at least as long as a cavity side. The other side, which is close to the connection pad 124, is greater than about ½ of the length of the adjacent cavity side. A plurality of LEDs are disposed on the upper surface 102 of the electrically conductive chip carrier 142. For example, in FIGS. 1-3, three LEDs 44, 46, and, 48 are disposed on the connection pad 60 of the upper surface 102. The three LEDs usually emit lights in different color. For example, the LED 44 may emit red light, the LED 46 may emit green light and the LED 48 may emit blue light. Two or more of the LEDs may emit the same color, including white. For example, the LED 44 and the LED 46 may both emit red light. Each LED has a first electrical terminal and a second electrical terminal.

The first electrical terminal may be called an anode. For example, the first LED 44 has an anode electrically coupled to the first electrically conductive chip carrier 144. The second and third LED 46 and 48 each has an anode electrically coupled to the second and third electrically conductive chip carrier 146 and 148, respectively. The chip carrier 142 also works as a heat sink to dissipate heat from the plurality of LEDs.

The dimensions of the blue and green LEDs have a width of about 205 microns to about 275 microns and a length of about 285 microns to about 355 microns. In one embodiment, the blue and green LEDs have a width of about 240 microns and a length of about 320 microns. The thickness of the blue and green LEDs can vary from about 100 microns to about 130 microns, and preferably, about 115 microns.

The red LEDs have two preferred sizes. In a first embodiment, the red LEDs have a preferred width and length of about 355 microns, but can range in size from about 330 microns to about 380 microns. The thickness of the red LEDs in this embodiment are preferably about 70 microns to about 125 microns, and more preferably about 100 microns. In this embodiment, the red LEDs have bonding pads ranging in size from about 90 microns to about 110 microns, and preferably about 100 microns.

In a second embodiment, the red LEDs have a preferred width and length of about 290 microns, but can range from about 265 microns to about 315 microns. The preferred thickness of the red LEDs in this embodiment is substantially the same as the first embodiment, but the thickness ranges from about 85 microns to about 115 microns. In this embodiment, the red LEDs have bonding pads ranging in size from about 80 microns to about 100 microns, and preferably about 90 microns.

Each of the first, second and third electrically conductive connection parts has an upper surface, a lower surface or terminal, and a connection pad on the upper surface. For example, in FIG. 3, the first electrically conductive connection part 144 has an upper surface 104, a lower surface 84, and a connection pad 124 on the upper surface 104. The first electrically conductive connection part 144 is at least partially surrounded by the electrically conductive chip carrier 142. The second electrically conductive connection part 146 has an upper surface 106, a lower surface 86, and a connection pad 126 on the upper surface 106. The third electrically conductive connection part 148 has an upper surface 108, a lower surface 88, and a connection pad 128 on the upper surface 108. A surface area of the upper surface 104 of the first electrically conductive connection part 144 is less than an upper surface area of the upper surface 106 or 108.

The casing 12 may be generally rectangular, including opposed, first and second main surfaces 24 and 26, respectively, opposing respective side surfaces 28 and 30, and end surfaces 32 and 34. The first and second main surfaces may also be referred to as the upper and lower surfaces. In one embodiment, the distance between the upper and lower surfaces 24 and 26, or the package profile height is less than about 1.0 mm. Preferably, the distance h between the upper and lower main surfaces 24 and 26 is about 0.85 mm to about 0.95 mm. More preferably, the distance h between the upper and lower main surfaces 24 and 26 is about 0.90 mm. The distance w between the side surfaces 28 and 30 and distance I between the end surfaces 32 and 34 are preferably less than about 2.0 mm. Preferably, the distance w between the side surfaces 28 and 30 is about 1.85 mm to about 2.0 mm, and the distance I between the end surfaces 32 and 34 also ranges between about 1.85 mm to about 2.0 mm. More preferably, the distance w between the side surfaces 28 and 30 is about 1.95 mm, and the distance I between the end surfaces 32 and 34 is about 1.95 mm.

By way of example and not limitation, the surface mount LED package 10 may have an overall length L of about 1.95 mm, an overall width W of about 1.95 mm, and a height H of about 0.90 mm.

The plastic casing 12 further defines a recess or cavity 36 extending from the upper surface 24 into the body of the plastic casing 12. In some embodiments, a reflective insert or ring 38 may be positioned and secured along at least a portion of a side or wall 40 of the cavity 36. Also, the reflective insert or ring 38 may be integral with the plastic casing 12 and may be made from the same material as the plastic casing 12. The effectiveness of the reflectivity of the ring 38 is preferably enhanced by tapering the cavity 36 and ring 38 carried therein inwardly toward the interior of the casing. The preferred shape of the cavity 36 is a square-like or rectangular shaped cavity. The square-like shape results in a surface mount LED package 10 with a more uniform wall thickness on each side of the side surfaces 28 and 30 and end surfaces 32 and 34. Thus, in accordance with an aspect of the disclosure, the size of the cavity is increased compared to, for example, circular shaped cavities. The ratio of the area of the cavity floor over the area of the main surface is at least 35%. In some embodiments, it is greater than 40%. In still other embodiments, the ratio is greater than 50%.

The casing 12 is fabricated from materials that are both electrically insulating and thermally conductive. In one embodiment, the casing is a thermoplastic polycondensate. A particularly preferred thermoplastic polycondensate is polyphthalamide (PPA). In a preferred embodiment, the casing 12 may be formed of black PPA or white PPA. It has been found that the use of black material in image generation SMD packages, such as with SMDs employed in video displays, improves contrast. Other casing materials include ceramics, resins, epoxies, and glass.

In the illustrative embodiment of FIGS. 1 and 2, the three LEDs 44, 46, 48 in the surface mount LED package 10 preferably emit red, green and blue colors, respectively, so that when appropriately energized the LEDs produce in combination a substantially full range of colors. The LED chips may have a square like size or rectangular size. For example, the square like LED chip may have a profile height less than bout 0.11 mm, or in the range of about 0.09 mm to about 0.11 mm, or less than about 0.1 mm, or in the range of about 0.08 to 0.10 mm. The square like LED chip may have a profile width of less than about 0.32 mm, or in the range of 0.265 mm to 0.315 mm. The square like LED chip may have a profile width of less than about 0.38 mm, or in the range of about 0.33 mm to about 0.38 mm. The rectangular like LED chip may have a profile height of less than about 0.13 mm, or in the range of about 0.10 mm to about 0.13 mm. The rectangular like LED chip may have a profile width of less than about 0.28 mm, or in the range of about 0.20 mm to about 0.28 mm. The rectangular like LED chip may have a profile width of less than about 0.36 mm, or in the range of about 0.28 mm to about 0.36 mm.

In the illustrative embodiment, the red LED 44 is disposed between the first and second electrically conductive connection parts 144, 146 (FIG. 3). The green LED 46 is disposed near the center of the cavity 36. The blue LED 48 is disposed near the third electrically conductive connection parts 148. To dissipate heat from the LEDs, it is preferable to increase the upper surface area of the upper surface 102. However, the surface areas of the first, second, and third electrically conductive connection parts 144, 146, and 148 should be large enough to respectively hold the connection pad 124, 126, and 128.

The LED chips 44, 46, 48 extend in a transverse direction along a first center axis 62 of the surface mount LED package 10, that is, in a direction about perpendicular to the side surfaces 28 and 30. The leads 50, 52, 54, 56 are about parallel to each other and extend in a direction about perpendicular to the direction 62 along a second center axis 62a of the surface mount LED package 10. The first axis and the second axis cross each other near the center of the second LED chip 46.

In this embodiment, the electrically conductive connection parts are designed by providing bond pads, mold flowing, heat dissipation and chip position so that the heat dissipation from the red LED 44 is improved compared with prior disclosures, such as disclosed in the applicants co-pending U.S. patent application Ser. No. 12/152,766, the disclosure of which is incorporated by reference herein. Referring to FIG. 3, enhanced heat dissipation is realized by a surface area of the upper surface 104 of the first electrically conductive connection part 144 that is minimized to only have enough space to hold a connection pad 124. The surface area of the upper surface 104 is less than a surface area of either upper surface 106 or 108 of the second and third electrically conductive connection parts 126 and 128.

At the same time, to make sure that the PPA fluid flows uniformly in each direction when forming the casing 12, the contours 112 and 114 of the upper surfaces 102 and 104 are asymmetrical with respect to the second axis 62a. Similarly, the contours 116 and 118 of the upper surface of the second and third electrically conductive connection parts 146 and 148 are asymmetrical with respect to the second axis 62a.

Figure 5:
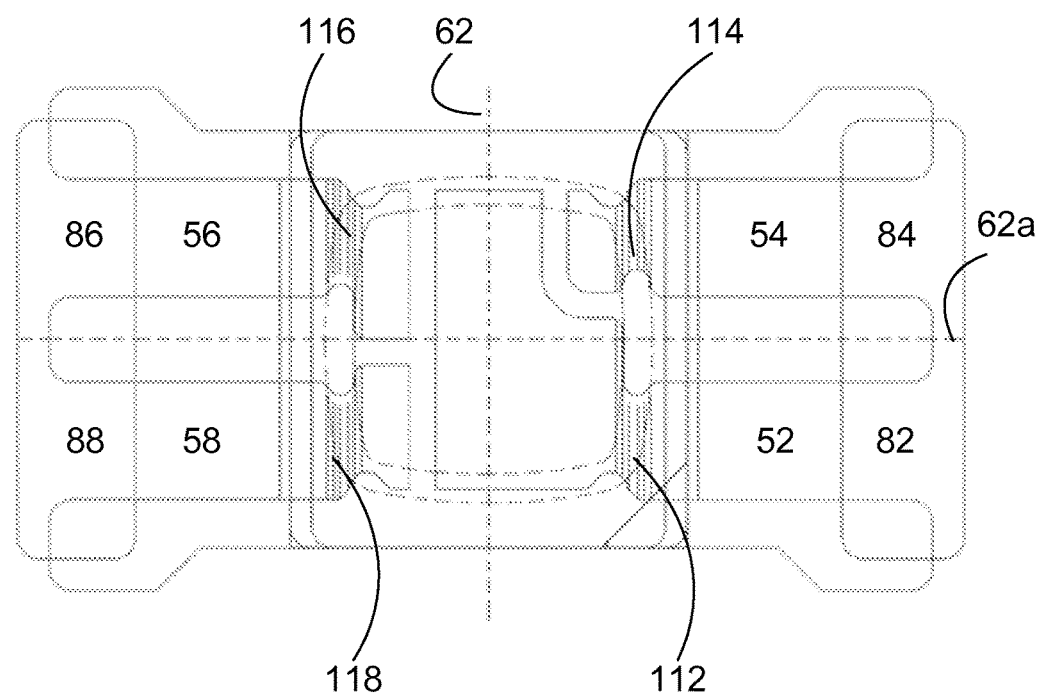
FIG. 5 is a top view of the lead frame shown in FIG. 3.

Alternatively or additionally, as shown in FIG. 5, the contours 112 and 114 of the upper surfaces 102 and 104 may be made asymmetrical with respect to a plane that is about perpendicular to the first axis 62 and includes the second axis 62a. Similarly, the contours 116 and 118 of the upper surface of the second and third electrically conductive connection parts 146 and 148 may be made asymmetrical with respect to such a plane includes the second axis 62a.

The electrically conductive connection parts 144, 146, and 148 include enlarged electrical connection pads 124, 126, 128, respectively, positioned in the central region 58 adjacent to, but spaced apart from, the component carrying upper surface 102 of the connection part 142. In a preferred form of the surface mount LED package 10, the leads 52, 54, 56, and 58 are bent to extend outside of and along their respective end surfaces 32 and 34 of the casing, then bent again so that lower surfaces 82, 84, 86, and 88 of the leads extend along the lower surface 26 of the plastic casing 12. The lower surfaces 82, 84, 86, and 88 may also be referred to as pin pads. The outwardly facing surfaces of the lower surfaces 82, 84, 86, and 88 of the leads and the bottom surface of a thermal conductive body are substantially flush to facilitate connection to an underlying substrate. The lower surfaces 82, 84, 86, and 88 of the leads are electrically connected or bonded to traces or pads on the substrate using any of a number of well-known connection techniques, including soldering.

Figure 6:
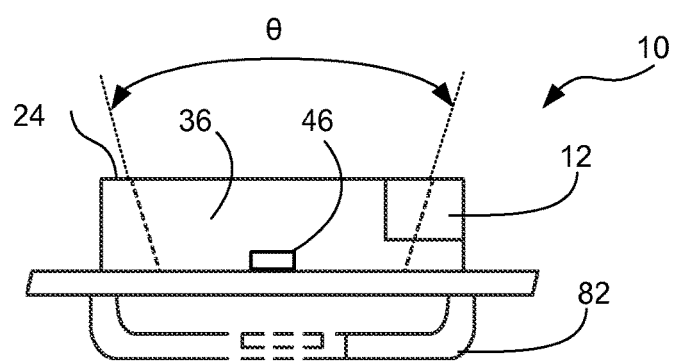
FIG. 6 is a cross-sectional view of the embodiment of FIG. 2 taken along section line 6-6.

In a preferred embodiment, solder pads are included on the bottom of the end portions such that no solder is visible when viewing each individual SMD from the top. This is advantageous as it helps to prevent glare and improve contrast, particularly during daylight viewing. As best seen in FIGS. 1 and 6, the cavity 36 extends into the casing interior a sufficient depth to expose the connection pads 60 and 124, 126, 128.

The particular dimensions of the lower surfaces 82, 84, 86, and 88 of the leads 52, 54, 56, and 58 that extend inwardly from the end surfaces 32 and 34 of the casing may depend on the intended implementation of the surface mount LED package, the LEDs to be utilized, the material of the casing 12, the size of the SMD and/or other such factors and/or combinations of factors. In some embodiments, each of the leads 50, 52, 54, 56 exterior of the casing may be separated by gaps 92 between pads to electrically isolate the connection parts from each other.

The electrically conductive chip carrier 142 and the electrically conductive connection parts 144, 146, 148 may be made from an electrically conductive metal or metal alloy, such as copper, a copper alloy, other suitable low resistivity, corrosion resistant materials, or combinations of these materials. Because all the LED chips are disposed on the electrically conductive chip carrier 142, a large surface area of the upper surface 102 may help heat dissipation.

Each of the LEDs 44, 46, and 48 may be electrically coupled with the connection pad 60 by means of an electrically and thermally conductive interface 100 such as a solder, adhesive, coating, film, encapsulant, paste, grease and/or other suitable material. In a preferred embodiment, the LEDs 44, 46, and 48 may be electrically coupled and secured to the connection pad 60 using a solder pad on the bottom of the LEDs such that the solder is not visible from the top. Preventing the solder from being seen from the top is advantageous so as to reduce reflection and provide better contrast, particularly during the day time. Each of the LEDs 44, 46, and 48 may have a profile height about 0.1 mm. Each of the LEDs 44, 46, and 48 may have a profile width about 0.2 mm to about 0.4 mm. Each of the LEDs 44, 46, and 48 may have a profile length about 0.2 mm to about 0.4 mm.

In certain manufacturing methods in accordance with the disclosure, the LEDs 44, 46, and 48 may be coupled to the connection pad 60 prior to molding and/or assembling the casing 12 about the connection pads. Alternatively, the LEDs may be coupled to the connection pad 60 after the connector parts have been partially encased within the casing. The cavity 36 that extends into the casing may be configured so that sufficient portions of the connection pads 60 and 124, 126, 128 are exposed to receive the LEDs and the associated wire bonds.

Figure 7:
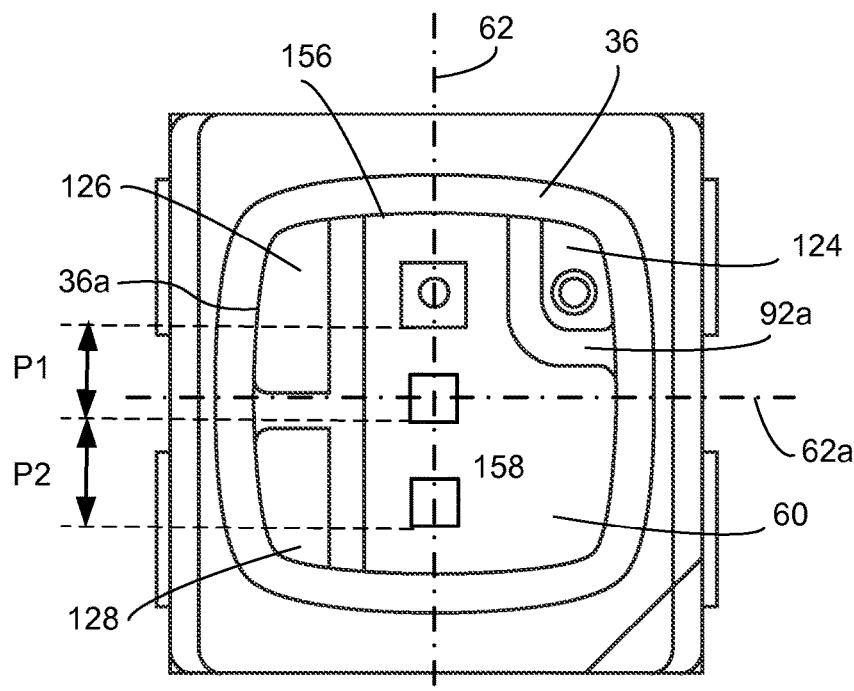
FIG. 7 is a top view of one embodiment of a surface mount device.

With reference now to FIGS. 6-7, some examples of the various components of an SMD package for LED 10 are shown. By way of example and not by limitation, the dimensions described below in association with the embodiment illustrated in FIGS. 6-7 may also apply to the surface mount package in FIGS. 1-5.

In the illustrative embodiment of FIG. 6, either the width or the length of the SMD package 10 is less than about 2.0 mm. Preferably, the width or length of the SMD is in the range of about 1.85 mm to about 2.05 mm. More preferably, the width or length of the SMD is about 1.95 mm. The profile height of the SMD package 10 is less than about 1.0 mm. Preferably, the profile height of the SMD is in the range of about 0.85 mm to about 0.95 mm. More preferably, the profile height of the SMD is about 0.9 mm. The cavity 36 has an opening width in the range of about 1.48 mm to about 1.58 mm in the upper surface and a width in the range of about 1.21 to about 1.31 mm in the lower surface. Preferably, the cavity 36 has an opening width of about 1.53 mm in the upper surface and a width of about 1.26 mm in the lower surface. The angle θ between the two side surfaces of the cavity is in the range of about 28.0° to about 38.00°, preferably at about 33.0°. The width of the lower surface 82 is in the range of about 0.58 mm to about 0.62 mm, preferably about 0.6 mm. The thickness of the lower surface 82 is about 0.08 mm. A width of the cavity opening 36 in the first main surface 24 is in the range of about 1.4 mm to about 1.55 mm. The opening of the cavity 36 in the first main surface has an area larger than about 50% and less than about 65% of a total area of the first main surface 24. The casing surround the cavity has a wall thickness in the range of about 0.10 mm to about 0.35 mm. Specifically, the wall thickness of the casing is thinner near the first main surface 24 than the wall thickness of the casing near the connection pad 60.

In FIG. 7, the exposed connection pad 124 has a size of about 0.25 mm by about 0.36 mm. The connection pad 60 of the upper surface 102 has an L shape. The lower right portion of the L shape covers the whole lower right region 158 on the lower surface 156 of the cavity 36. The lower right region 158 is defined by the cavity contour and the first and second center axis 62 and 62a. There is an L shape gap 92a between the connection pads 60 electrically conductive chip carrier 142 and the connection pad 124 of the first electrically conductive connection part 144. The L shape gap 92a is disposed above the second center axis 62a. The connection ball has a diameter about 0.12 mm. There is a pitch about 0.05 mm on each side of the connection ball. Therefore, the connection pad 124 should be larger than about (0.12+0.05+0.05)=0.22 mm. At the same time, there must be some allowed manufacturing error about 0.02 mm to about 0.03 mm. Thus, the minimum possible connection pad has an optimal width of about 0.25 mm. The pitch P1 or P2 between two adjacent LEDs is about 0.3 mm to about 0.4 mm. Further, as illustrated in FIGS. 2 and 7, a center of mass of the electrically conductive chip carrier 142 is offset with respect to a geometric center of the cavity 36. The ratio of the area of the cavity floor 36a over the area of the main surface 24 is at least 35%. In some embodiments, the ratio is greater than 40%. In still other embodiments, the ratio is greater than 50%.

Figure 8:
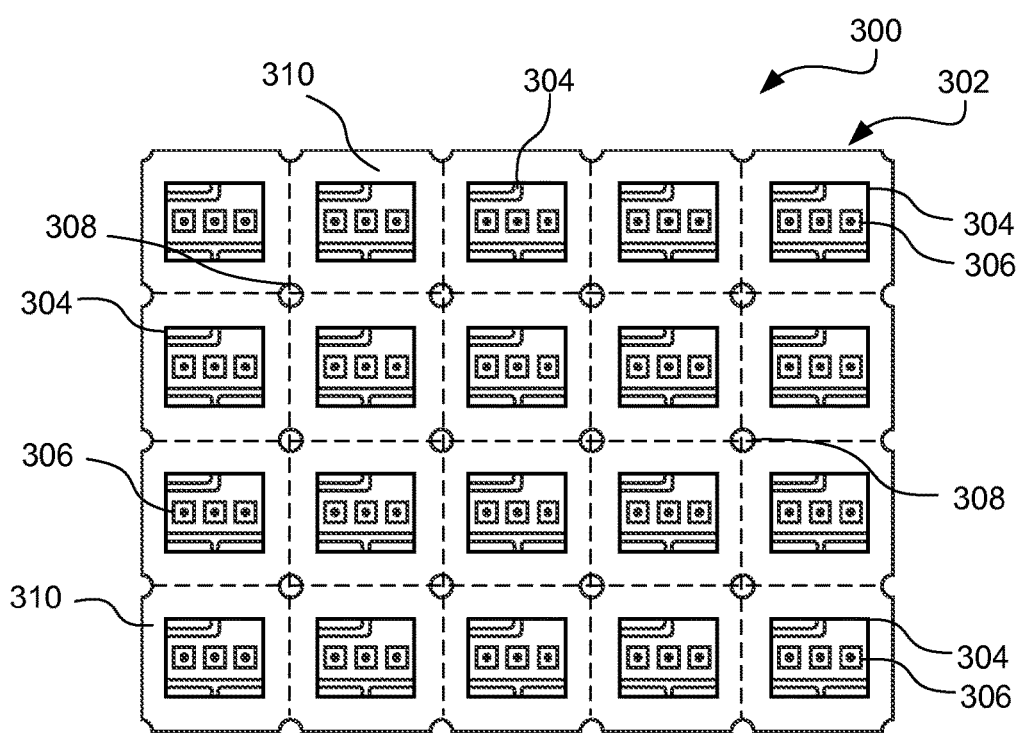
FIG. 8 is a front elevation view of a portion of an LED display screen incorporating surface mount devices in accordance with embodiments of the present disclosure.

FIG. 8 schematically illustrates a portion of an LED display screen 300, for example, an indoor screen comprising, in general terms, a driver PCB 302 carrying a large number of SMDs 304 arranged in rows and columns, each SMD defining a pixel 310. Each pixel 310 of the display may have a size about 2.8 mm or less by about 2.8 mm or less. The SMDs 304 may include devices such as those described above and illustrated in FIGS. 1-7. The SMD devices 304 are electrically connected to traces or pads on the PCB 302 that are interconnected to provide appropriate electrical signal processing circuitry and driver circuitry (not shown).

As disclosed above, each of the SMDs carries a vertically oriented, linear array 306 of red, green and blue LEDs. Such a linear orientation of the LEDs has been found to improve color fidelity over a wide range of viewing angles. Through-holes 308 may also be provided to allow for better and shorter contact for the plastic SMD body to the PCB. Through-holes 308 also allow for improved thermal dissipation.

From the foregoing, it can be seen that the present embodiments provide a mini surface mount LED package including a plurality of LEDs on a lead frame partially encased by a plastic casing. The disclosed mini surface mount LED package has a lower operating temperature and lower manufacturing cost compared with previous disclosures.

It is therefore intended that the foregoing detailed description be regarded as illustrative rather than limiting, and that it be understood that it is the following claims, including all equivalents, that are intended to define the spirit and scope of this disclosure.

The invention claimed is:

1. A light emitting diode (LED) package comprising:
a lead frame comprising an L shaped electrically conductive chip carrier;
a plurality of LEDs on an upper surface of the L shaped electrically conductive chip carrier; and
a casing comprising opposed, first and second main surfaces having a height distance therebetween, opposed side surfaces having a width distance therebetween, and opposed end surfaces having a length distance therebetween, the casing at least partially encases the lead frame and defines a cavity extending into the interior of the casing from the first main surface, at least a portion of the L shaped electrically conductive chip carrier is exposed at a floor of the cavity,
wherein the lead frame further comprises first, second, and third electrically conductive connection parts separate from the L shaped electrically conductive chip carrier, the second and third electrically conductive connection parts disposed on a same side of the L shaped electrically conductive chip carrier, the first, second and third electrically conductive connection parts each electrically coupled to a different one of the plurality of LEDs via a different one of a plurality of wire bonds, and each of the first, second and third electrically conductive connection parts having an upper surface, a lower surface, and a connection pad on the upper surface, and
wherein an L shaped gap separates the L shaped electrically conductive chip carrier from the first electrically conductive connection part,
wherein the upper surface of the first electrically conductive connection part and the L shaped gap are dimensioned such that the upper surface of the first electrically conductive connection part has the smallest surface area among the upper surfaces of the first, second, and third electrically conductive connection parts, and the L shaped gap is completely disposed on one side of a horizontal center axis that extends perpendicular to the same side of the L shaped electrically conductive chip carrier on which the second and third electrically conductive connection parts are disposed.

2. The LED package of claim 1, wherein the lead frame is bent and comprises a profile thickness less than about 0.5 mm.

3. The LED package of claim 1, wherein the lead frame is bent and comprises a profile thickness less than 0.42 to about 0.48 mm.

4. The LED package of claim 1, wherein the height distance is less than about 1.0 mm.

5. The LED package of claim 4, wherein the height distance is than about 0.85 mm to about 1.0 mm.

6. The LED package of claim 1, wherein the height distance is less than about 0.9 mm.

7. The LED package of claim 1, wherein the width and length distances are less than about 1.85 mm.

8. The LED package of claim 7, wherein the width and length distances are about 1.85 mm to about 2 mm.

9. The LED package of claim 8, wherein the width and length distances are about 1.95 mm.

10. The LED package of claim 1, wherein the casing at least partially encases the lead frame and defines a cavity extending into the interior of the casing from the first main surface, wherein at least a portion of the electrically conductive chip carrier is exposed in the cavity, an exposed portion of the conductive chip carrier comprising opposing sides where one side is at least as long as a cavity side, and the other side is greater than about ½ of the length of the adjacent cavity side.

11. The LED package of claim 1, wherein at least a portion of the plurality of LEDs on the upper surface of the electrically conductive chip carrier are set at a pitch of less than about 0.4 mm.

12. The LED package of claim 11, wherein the pitch is about 0.3 mm to about 0.4 mm.

13. The LED package of claim 1, wherein the LED package has a profile width of about 1.85 mm to about 2.00 wherein the lead frame has a profile thickness of about 0.42 mm to about 0.48 mm and the LED package has a profile height of about 0.85 mm to about 0.95 mm.

14. The LED package of claim 1, wherein the LED package has a profile width of about 1.85 mm to about 2.0 mm and a profile length of about 1.85 mm to about 2.0 mm and the cavity has a depth of about 0.42 mm to about 0.48 mm.

15. The LED package of claim 1, wherein the lead frame comprises a sheet metal and a plastic casing comprises a thermoplastic.

16. The LED package of claim 1, wherein each LED includes a first electrical terminal and a second electrical terminal, wherein for each of the plurality of LEDs, the first electrical terminal is electrically coupled to the electrically conductive chip carrier and the second electrical terminal is electrically coupled to the connection pad of a corresponding one of the first, second, or third electrically conductive connection parts via one of the plurality of wire bonds.

17. The LED package of claim 16, wherein a selected one of the plurality of LEDs emits red light, and the second electrical terminal of the selected LED is electrically coupled to the connection pad of the first electrically conductive connection part.

18. The LED package of claim 1, wherein the plurality of LEDs comprise LEDs that individually emit red, green, or blue light, and wherein at least the blue and green LEDs have a width about 0.3 mm to about 0.4 mm and a length about 0.3 mm to about 0.4 mm.

19. The LED package of claim 1, wherein a plastic casing comprises one of white polyphthalamide or black polyphthalamide.

20. The LED package of claim 1, wherein a center of mass of the electrically conductive chip carrier is offset with respect to a geometric center of the cavity.

21. The LED package of claim 1, wherein ratio of the area of the cavity floor to the area of the main surface is at least about 40%.

22. The LED package of claim 21, wherein ratio of the area of the cavity floor to the area of the main surface is at least about 50%.

23. A light emitting diode (LED) package comprising:
a bent lead frame comprising an electrically conductive chip carrier and comprising a profile thickness of less than about 0.5 mm;
a plurality of LEDs on an upper surface of the electrically conductive chip carrier; and
a polymer casing at least partially encasing the lead frame and having a cavity therein exposing the plurality of LEDs,
wherein the lead frame further comprises first, second, and third electrically conductive connection parts separate from the electrically conductive chip carrier, the second and third electrically conductive connection parts disposed on a same side of the electrically conductive chip carrier, a gap separates two sides of the first electrically conductive connection part from the electrically conductive chip carrier, the first, second and third electrically conductive connection parts each electrically connected to a different one of the plurality of LEDs via a different one of a plurality of wire bonds, and each of the first, second and third electrically conductive connection parts having an upper surface, a lower surface, and a connection pad on the upper surface, and wherein the upper surface of the first electrically conductive connection part and the gap are dimensioned such that the upper surface of the first electrically conductive connection part has the smallest surface area among the upper surfaces of the first, second, and third electrically conductive connection parts, and the gap is completely disposed on one side of a horizontal center axis that extends perpendicular to the same side of the electrically conductive chip carrier on which the second and third electrically conductive connection parts are disposed.

24. The LED package of claim 23, wherein the polymer casing comprises opposed, first and second main surfaces having a height distance therebetween, opposed side surfaces having a width distance therebetween, and opposed end surfaces having a length distance therebetween, wherein the height distance is less than about 1.0 mm, and the width distance and the length distance are less than about 2.0 mm.

25. The LED package of claim 24, wherein the casing at least partially encases the lead frame and defines a cavity extending into the interior of the casing from the first main surface, at least a portion of the electrically conductive chip carrier is exposed in the cavity, wherein an exposed portion of the conductive chip carrier comprises opposing sides where one side is at least as long as a cavity side, and the other side is greater than about ½ of the length of the adjacent cavity side.

26. The LED package of claim 24, wherein the height distance is less than about 1.0 mm.

27. The LED package of claim 23, wherein the plurality of LEDs comprise LEDs that emit red, green, and blue light disposed along a vertical center axis of the surface mount device, and wherein a height distance is in the range of about 0.85 to about 0.95 mm, the width distance and the length distance are in the range of 1.85 mm to 2.00 mm.

28. The LED package of claim 27, each LED having a first electrical terminal and a second electrical terminal, wherein the first electrical terminal of each LED is electrically coupled to the electrically conductive chip carrier, and wherein a selected one of the plurality of LEDs emits red light, and the second electrical terminal of the selected LED is electrically coupled to the connection pad of the first electrically conductive connection part.

29. The LED package of claim 28, wherein the second electrical terminal of each LED is electrically coupled to the connection pad of a corresponding one of the first, second, and third electrically conductive connection parts.

30. The LED package of claim 29, wherein the electrically conductive chip carrier comprises a body having an approximate L shaped geometry and a lower right portion of the L shaped extends beyond the horizontal center axis of the surface mount device.

31. The surface mount device of claim 30, wherein the gap is an L shape gap.

32. The LED package of claim 23, wherein the electrically conductive chip carrier and the electrically conductive connection parts comprise sheet metal and a plastic casing comprises a thermoplastic.

33. The LED package of claim 23, wherein the cavity has a depth of about 0.42 mm to about 0.48 mm.

34. The LED package of claim 23, wherein for each of the plurality of LEDs, an electrical terminal is electrically coupled to the connection pad of a corresponding one of the first, second, or third electrically conductive connection parts via one of the plurality of wire bonds.

35. The LED package of claim 23, wherein the casing comprises one of white polyphthalamide or black polyphthalamide.

36. The LED package of claim 23, wherein a width of the cavity opening in first main surface is about 1.4 to 1.55 mm.

37. The LED package of claim 36, wherein an opening of the cavity in first main surface has an area larger than about 50% and less than about 70% of a total area of the first main surface.

38. The LED package of claim 19, wherein the casing surround the cavity has a wall thickness in the range of about 0.10 mm to 0.35 mm.

39. A light emitting diode (LED) package comprising:
a black polymer casing at least partially encasing the lead frame and defining a cavity extending into the interior of the black polymer casing from a first main surface of the black polymer casing; and
a lead frame at least partially encased by the black polymer casing, the lead frame comprising an L shaped electrically conductive chip carrier at least a portion of which is exposed in the cavity, the exposed portion of the conductive chip carrier comprising opposing sides where one side is at least as long as a cavity side, and the other side is greater than about ½ of the length of the adjacent cavity side,
wherein the conductive chip carrier comprises a raised edge configured to engage the black polymer casing; and
wherein the lead frame further comprises first, second, and third electrically conductive connection parts separate from the electrically conductive chip carrier, the second and third electrically conductive connection parts disposed on a same side of the electrically conductive chip carrier, a gap separates two sides of the first electrically conductive connection part from the L shaped electronically conductive chip carrier, the first, second and third electrically conductive connection parts each configured not to carry a chip, and each of the first, second and third electrically conductive connection parts having an upper surface, a lower surface, and a connection pad on the upper surface, and
wherein the upper surface of the first electrically conductive connection part and the gap are dimensioned such that the upper surface of the first electrically conductive connection part has the smallest surface area among the upper surfaces of the first, second, and third electrically conductive connection parts, and the gap is completely disposed on one side of a horizontal center axis that extends perpendicular to the same side of the electrically conductive chip carrier on which the second and third electrically conductive connection parts are disposed.

40. A light emitting diode (LED) package comprising:
a lead frame comprising an electrically conductive chip carrier;

a plurality of LED dies on an upper surface of the electrically conductive chip carrier; and a polymer casing comprising opposed, first and second main surfaces having a height distance therebetween, opposed side surfaces having a width distance therebetween, and opposed end surfaces having a length distance therebetween, wherein the height distance, the width distance and the length distance are less than about 1.85 mm, wherein the lead frame further comprises first, second, and third electrically conductive connection parts separate from the electrically conductive chip carrier, the second and third electrically conductive connection parts disposed on a same side of the electrically conductive chip carrier, a gap separates two sides of the first electrically conductive connection part from the L shaped electronically conductive chip carrier, the first, second and third electrically conductive connection parts each electrically connected to a different one of the plurality of LED dies via a different one of a plurality of wire bonds, and each of the first, second and third electrically conductive connection parts having an upper surface, a lower surface, and a connection pad on the upper surface, and wherein the upper surface of the first electrically conductive connection part and the gap are dimensioned such that the upper surface of the first electrically conductive connection part has the smallest surface area among the upper surfaces of the first, second, and third electrically conductive connection parts, and the gap is completely disposed on one side of a horizontal center axis that extends perpendicular to the same side of the electrically conductive chip carrier on which the second and third electrically conductive connection parts are disposed.

41. The LED package of claim 40, wherein the polymer casing at least partially encases the lead frame and defines a cavity extending into the interior of the casing from the first main surface thereof, the lead frame comprising an electrically conductive chip carrier at least a portion of which is exposed in the cavity.

42. The LED package of claim 1, wherein the casing comprises a polymer casing.

43. The LED package of claim 1, wherein the height distance, the width distance and the length distance are less than about 2 mm.

* * * * *